(12) United States Patent
Dai et al.

(10) Patent No.: US 6,298,105 B1
(45) Date of Patent: Oct. 2, 2001

(54) METHOD AND APPARATUS FOR A LOW SKEW, LOW STANDBY POWER CLOCK NETWORK

(75) Inventors: Xia Dai, Fremont, CA (US); George Geannopuolos, Portland, OR (US); John Orton, Los Altos, CA (US); Keng Wong; Greg F. Taylor, both of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/183,031

(22) Filed: Oct. 30, 1998

(51) Int. Cl.[7] .............................. H04L 1/00; H04L 25/00; H04L 25/40
(52) U.S. Cl. ............................................ 375/371; 327/149
(58) Field of Search .................................... 375/371, 373, 375/375, 376; 327/144, 146, 147, 149, 150, 151, 153, 155, 156, 158, 159, 161, 162, 141; 326/93, 96

(56) References Cited

U.S. PATENT DOCUMENTS

| | | | |
|---|---|---|---|
| 5,079,519 | * | 1/1992 | Ashby et al. . |
| 5,095,233 | * | 3/1992 | Ashby et al. . |
| 5,121,010 | * | 6/1992 | Hoshizaki et al. . |
| 5,128,554 | * | 7/1992 | Hoshizaki . |
| 5,307,381 | * | 4/1994 | Ahuja . |
| 5,398,262 | * | 3/1995 | Ahuja .................................. 375/356 |
| 5,742,650 | * | 4/1998 | nuckolls et al. ...................... 375/376 |
| 5,777,498 | * | 7/1998 | cometti et al. ........................ 327/156 |
| 5,969,552 | * | 10/1999 | Lee et al. .............................. 327/153 |
| 6,014,751 | * | 1/2000 | Kardach et al. ...................... 713/324 |
| 6,021,500 | * | 2/2000 | Wang et al. .......................... 713/300 |

* cited by examiner

Primary Examiner—Chi Pham
Assistant Examiner—Jean B Corrielus
(74) Attorney, Agent, or Firm—Blakely, Sokoloff, Taylor & Zafman LLP

(57) ABSTRACT

An apparatus for a low skew, low standby power clock network for a synchronous digital system. The power clock network comprises a reference network, maintaining a reference clock signal, and four clock spines, each with its own respective clock signal. To reduce clock skew within the power clock network (i.e., to keep the clock signals of the clock spines synchronous with the reference clock signal), the present invention employs the use of active and passive delay elements to compensate for such skew. A phase relation extraction logic compares the phase of the clock signals from each respective clock spine to the reference clock signal of the reference network. If it is determined that the clock signals of the spines lag the reference clock signal, the phase relation extraction logic will use an active control driver to "speed-up" the clock signals of the clock spines. And, if the clock signals of the clock spines lead the reference clock signal, the phase relation extraction logic will use capacitive loadings to "slow down" such clock signals. Advantageously, the likelihood of the microprocessor achieving its maximum operating potential is greatly enhanced by the synchronization of such signals.

14 Claims, 6 Drawing Sheets

METHOD AND APPARATUS FOR A LOW SKEW, LOW STANDBY POWER CLOCK NETWORK

BACKGROUND OF THE INVENTION

1. Field of the Invention

The present invention relates generally to a computer clock network and, more particularly, to a method and apparatus for a low skew, low standby power clock network for a synchronous digital system (e.g., a microprocessor) using hybrid clock deskewing elements and low latency deskewing logic.

2. Description of the Related Art

The clock speed of microprocessors has increased dramatically over the past several years. In the early eighties, microprocessors had clock speeds typically ranging from 5 to 16 MHz, which was sufficient to handle computer applications during that time period. However, as computer applications became more complex over the years to meet the demands of the computer user, the sluggish processor speeds of the past did not suffice. Today, microprocessors have clock speeds far exceeding those of the past, running at more than 300 MHz. And, these clock speeds show no sign of reaching a pinnacle. The microprocessors of the not-to-distant future have projected clock speeds that will significantly dwarf today's clock speed standards. With these higher clock speeds, microprocessors are capable of handling more and more complex computer applications in shorter periods of time, thus providing inherent benefits to the computer user.

Currently, a microprocessor's clock speed is limited by clock skew. Clock skew is a phenomenon in which certain operational factors of the microprocessor affect the arrival times of clock pulses to its various processing components (e.g., flip-flops). Such operational factors could be, for example, voltage or temperature variations on the microprocessor chip.

As the clock speeds of these microprocessors increase, their clock cycles decrease, thus causing the clock pulses to occur more frequently. As a result of the shorter clock cycles, clock skew management becomes more important because clock skew has a much greater impact on these shorter clock cycles. That is, a clock skew of 30 picoseconds would have more of an effect on a shorter clock cycle of 1 nanosecond (of a higher-speed processor) than it would on a longer clock cycle of 4 nanoseconds (of a lower-speed processor), for example. Accordingly, the maximum operating potential of these higher-speed microprocessors may not be achieved as a result of the profound impact of clock skew on these shorter clock cycles.

The present invention is directed to overcoming, or at least reducing the effects of, one or more of the problems set forth above.

SUMMARY OF THE INVENTION

In one aspect of the present invention, a clock network for a synchronous digital system is provided. The clock network comprises a reference network, which maintains a reference clock signal and a plurality of clock spines, with each clock spine maintaining a respective spine clock signal. The clock network further comprises phase relation extraction logic that compares the phase relationships of the reference clock signal with the phase relationships of the spine clock signals. The phase relation extraction logic further adjusts the phase relationships of the spine clock signals in response to the comparison of the phase relationships.

In another aspect of the present invention, a method is provided for reducing clock skew in a clock network. A reference clock signal and a plurality of spine clock signals are provided. It is determined if the phase of the reference clock signal matches the phases of said spine clock signals. If the phases do not match, the phases of the spine clock signals are adjusted.

BRIEF DESCRIPTION OF THE DRAWINGS

Other objects and advantages of the invention will become apparent upon reading the following detailed description and upon reference to the drawings in which.

Figure 1A:
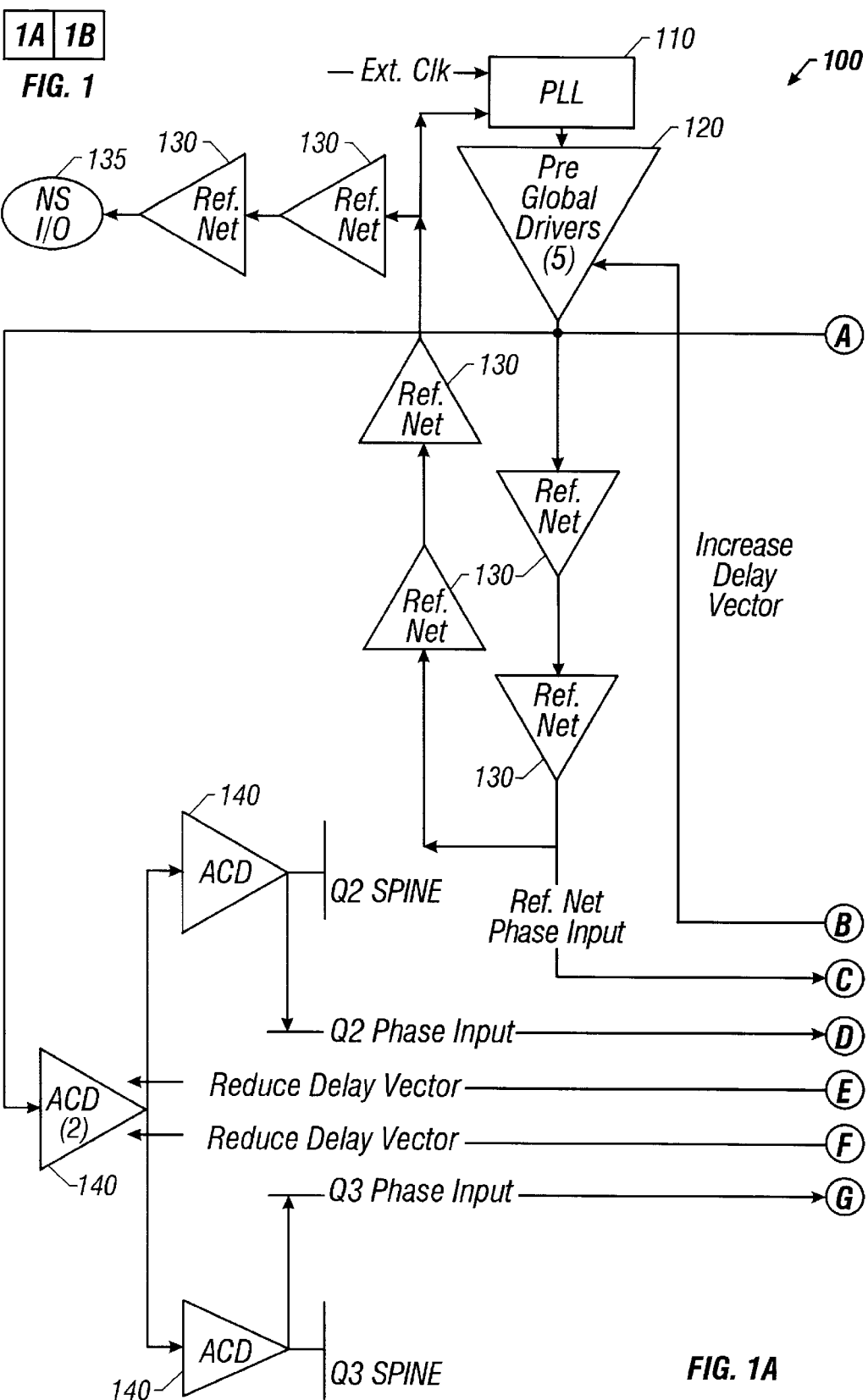
FIGS. 1A and 1B are block diagram of a global clock network of a synchronous digital system in accordance with one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nonetheless be a routine undertaking for those of ordinary skill in the art having the benefit of this disclosure.

Figure 1B:
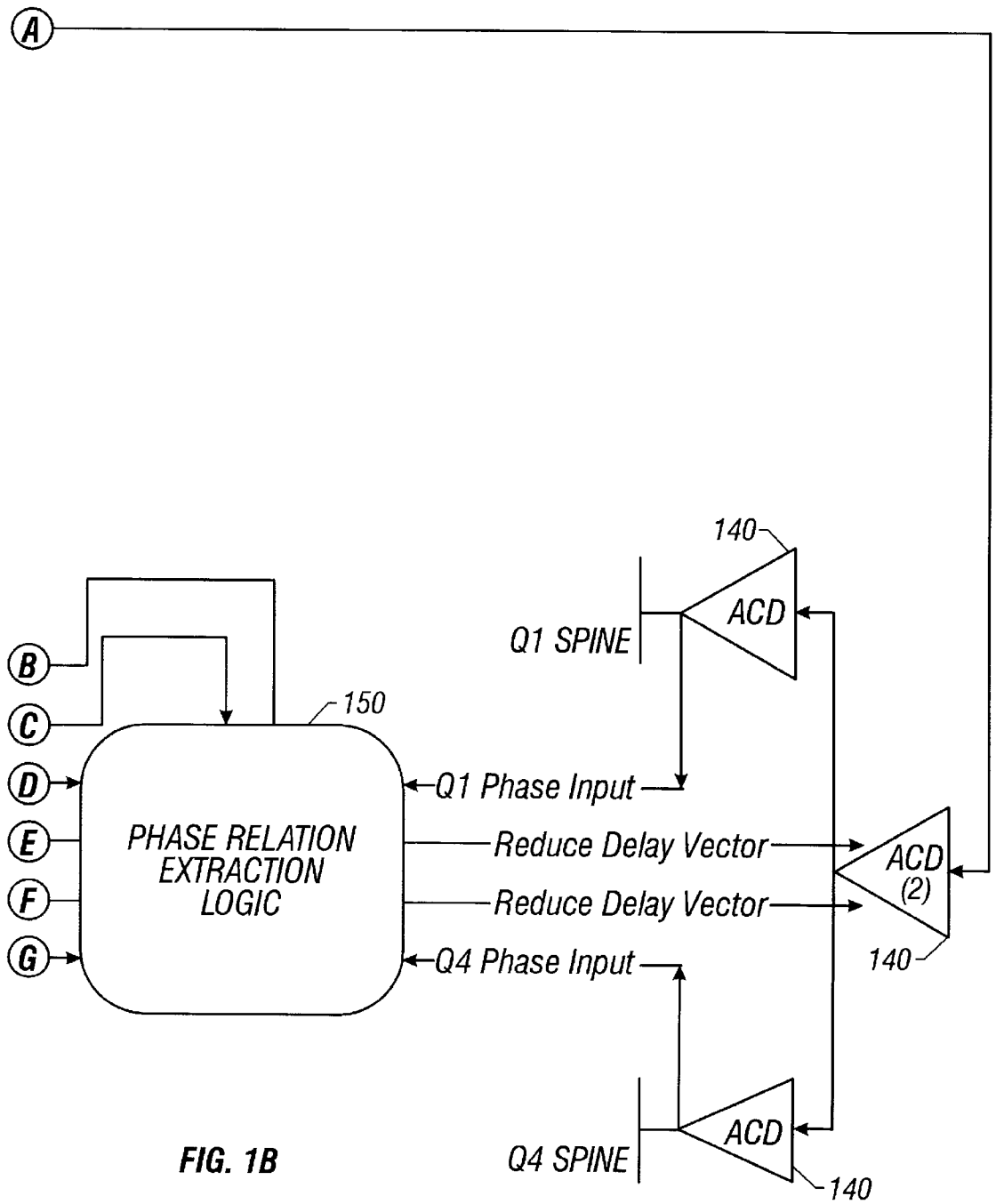

Turning now to the drawings and specifically referring to FIGS. 1A and 1B, a block diagram of a global clock network 100, which forms a part of a synchronous digital system (e.g., a microprocessor), is shown. The global clock network 100 distributes clock signals to various regions of the microprocessor (not shown). In the illustrated embodiment, the clock signals are distributed to four clock spines (i.e., quadrants Q1, Q2, Q3, and Q4) of the microprocessor; however, it will be appreciated that the number of clock spines need not necessarily number four. The use of four clock spines Q1–Q4, however, considerably reduces the RC/LC induced variations of clock skew, thus substantially increasing deskewing accuracy. Using multiple spines also creates more opportunity for powering down the clock spines Q1–Q4 and, therefore, saves active and standby power of the global clock network 100.

The global clock network 100 comprises a phased-locked loop (PLL) 110, which generates a series of synchronized clock signals that the logic in the microprocessor relies on to carry out particular tasks at a given instant of time. Subsequent to the generation of these clock signals by the PLL 110, the clock signals are passed through a pre-global network 120, which buffers the clock signals and distributes each respective clock signal to its corresponding region of the microprocessor (i.e., to each corresponding clock spine Q1–Q4). The pre-global network 120 is a set of five separate chains of inverters (not shown). One of the clock signals generated by the PLL 110 is maintained as a reference clock signal REF_CLK. The reference clock signal REF_CLK is used for synchronization purposes to compare to the other "quadrant" (or "spine") clock signals Q_CLKs that are distributed to each of the four clock spines Q1–Q4 of the microprocessor. The reference clock signal REF_CLK is passed through one of the five chains of inverters in the pre-global network 120, while the other quadrant clock signals Q_CLKs are passed through their own respective chain of inverters for distribution to their corresponding clock spines Q1–Q4 of the microprocessor via an active clock driver (ACD) 140.

Subsequent to exiting the pre-global network 120, the reference clock signal REF_CLK passes through a reference network 130, which is another set of inverters that buffer the signal. The reference network 130 also feeds back to the PLL 110 for synchronization of the reference clock signal REF_CLK with respect to an external clock, and also drives non-stoppable (i.e., continuously running) inputs/outputs 135. In the illustrated embodiment, the reference network 130 is continuously powered to monitor the non-stoppable inputs/outputs 135; whereas, each individual clock spine Q1–Q4 is intermittently powered as they are needed to perform a particular task by the microprocessor. Accordingly, power is conserved by the intermittent operation of these clock spines Q1–Q4.

The global clock network 100 further includes phase relation extraction logic 150, which is used to compare the phase relationships between the four quadrant clock signals Q_CLKs of the four clock spines Q1–Q4 and the reference clock signal REF_CLK of the reference network 130. Ideally, each of the four quadrant clock signals Q_CLKs and the reference clock signal REF_CLK will all be synchronous, thereby increasing the likelihood that the microprocessor is achieving its maximum operating potential. However, due to various operational circumstances of the microprocessor, typically clock skew occurs wherein the quadrant clock signals Q_CLKs become out of phase with the reference clock signal REF_CLK. Such phase differences of the reference clock signal REF_CLK and the quadrant clock signals Q_CLKs could result from voltage or temperature variations on the microprocessor chip, for example. The occurrence of clock skew causes the inefficient operation of the microprocessor and, accordingly, the microprocessor does not realize its full operating speed potential.

To reduce the clock skew, a combination of passive and active delay elements are used to compensate either the lead or lag of each respective quadrant clock signal Q_CLK to the reference clock signal REF_CLK such that all of the clock signals of the microprocessor become synchronized. In the illustrated embodiment, the active delay elements are PMOS and NMOS transistors of the active clock drivers (ACDs) 140 in the global clock network 100. The passive delay elements are capacitive loadings in the pre-global network 120.

Figure 2A:
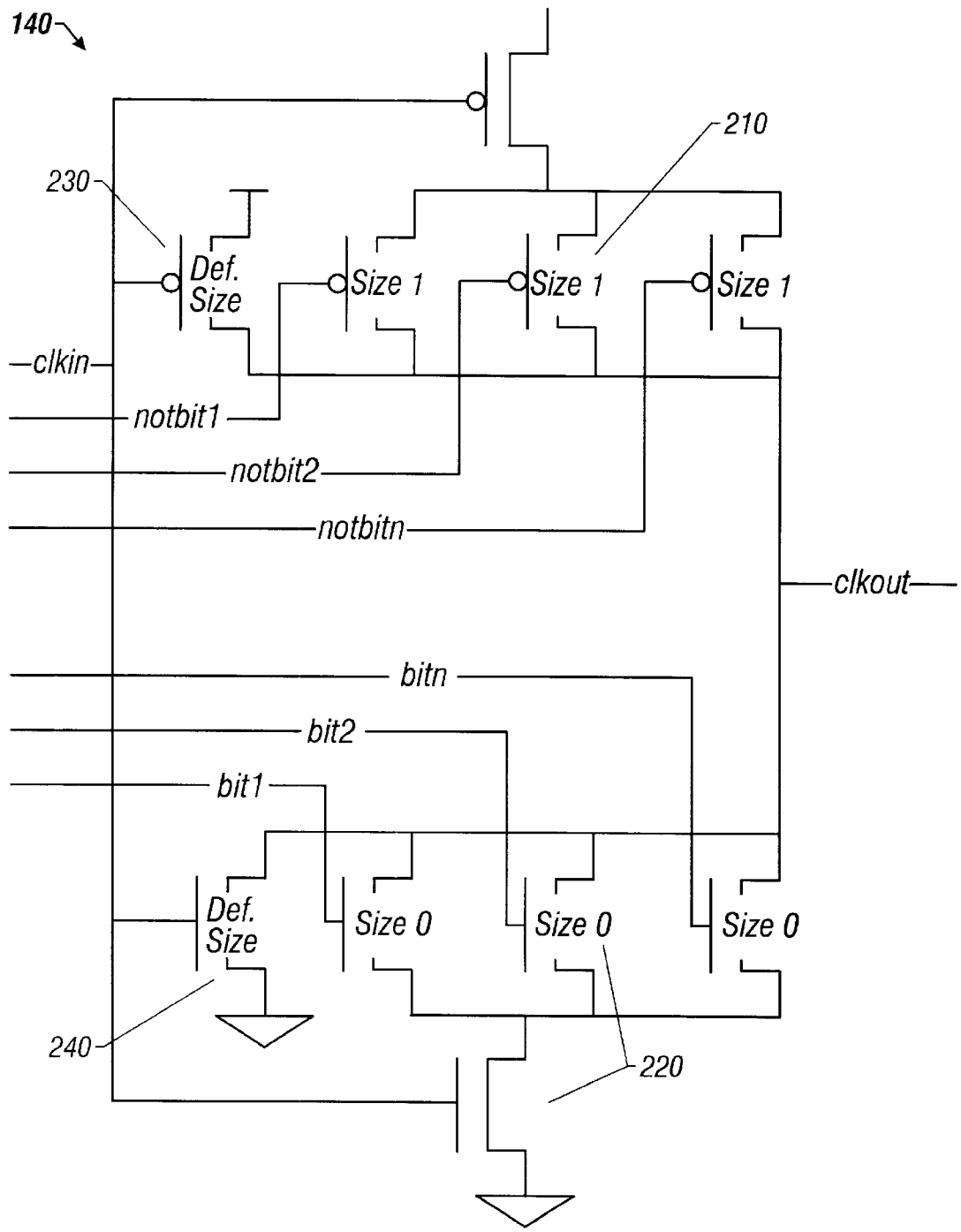
FIG. 2A is a schematic of an active clock driver (ACD) of FIGS. 1A and 1B.

Turning now to FIG. 2A, the ACD 140 is a tunable active driver comprising a series of PMOS transistors 210 and NMOS transistors 220. The ACD 140 is used to reduce any delay that occurs between the quadrant clock signals Q_CLKs of the clock spines Q1–Q4 and the reference clock signal REF_CLK of the reference network 130. That is, the ACD 140 essentially "speeds up" the quadrant clock signals Q_CLKs by turning "on" some (or all) of the series of PMOS and NMOS transistors 210, 220 when a reduction in the delay of the quadrant clock signals Q_CLKs is desired. In the ideal situation, where no reduction in delay is desired for the quadrant clock signals Q_CLKs, only PMOS and NMOS transistors 230, 240, respectively, are used by the ACD 140. However, when a reduction in a quadrant clock signal's delay is desired, the additional PMOS and NMOS transistors 210, 220 are turned on to reduce the delay of the quadrant clock signal Q_CLK. Typically, turning on each additional transistor set 210, 220 will reduce delay in one of the quadrant clock signals Q_CLKs by 10 to 20 picoseconds, in one embodiment. The manner in which these transistors 210, 220 are turned "on", as well as the number of the transistors 210, 220 that are to be turned "on" to appropriately reduce delay, will be further understood as the detailed description proceeds.

Figure 2B:
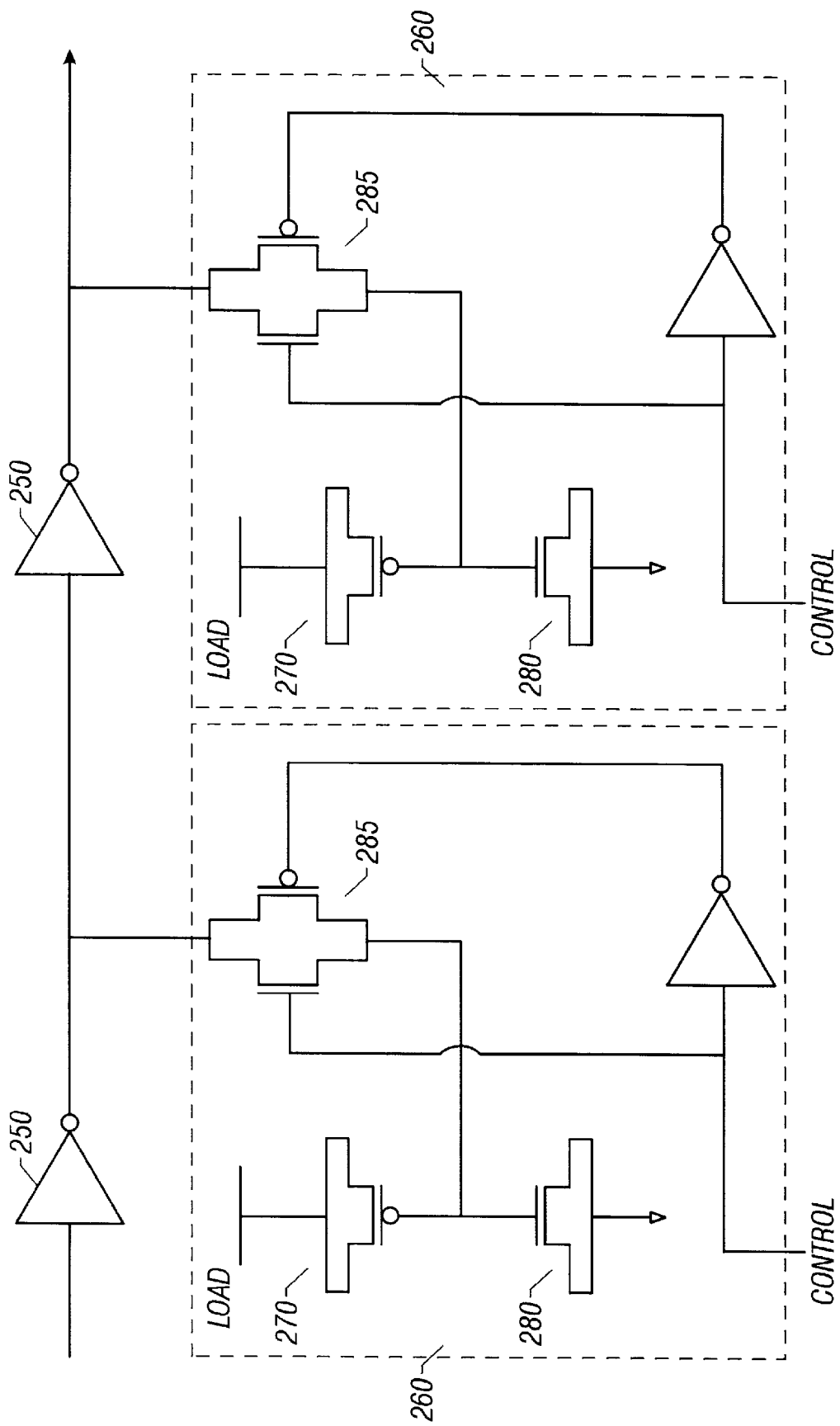
FIG. 2B is a schematic of passive delay elements residing in a pre-global network of FIGS. 1A and 1B.

Referring to FIG. 2B, the passive delay elements are shown in more detail. Inverters 250 of the pre-global network 120 are each respectively coupled to a capacitive load 260 containing the passive delay elements. The load 260 comprises PMOS transistor 270 and NMOS transistor 280 coupled to a transistor pair 285. The load 260 is added to the quadrant clock signal Q_CLK when the phase relation extraction logic 150 sends a control signal to the load 260 to turn "on" the transistor pair 285. Subsequently, a predetermined delay is added to the particular quadrant clock signal Q_CLK that leads the reference clock signal REF_CLK.

When one of the quadrant clock signals Q_CLK lags the reference clock signal REF_CLK (i.e., the quadrant clock signal is slower than the reference clock signal), an active delay approach is used to compensate the lagging quadrant clock signal Q_CLK. However, when one of the quadrant clock signals Q_CLK leads the reference clock signal REF_CLK, a passive delay approach is used, wherein the passive delay elements of the pre-global network 120 are used to compensate the quadrant clock signals Q_CLKs that lead the reference clock signal REF_CLK.

The phase relation extraction logic 150 receives phase-input signals, regarding the phase characteristics of the quadrant clock signals Q_CLKs, from each of the corresponding clock spines Q1–Q4. The phase relation extraction logic 150 also receives a phase-input signal regarding the reference clock signal REF_CLK from the reference network 130. Subsequent to receiving these phase input signals, the phase relation extraction logic 150 analyzes the phase input signals to determine how to compensate for such lead or lag in the quadrant clock signals Q_CLKs relative to the reference clock signal REF_CLK.

Figure 3:
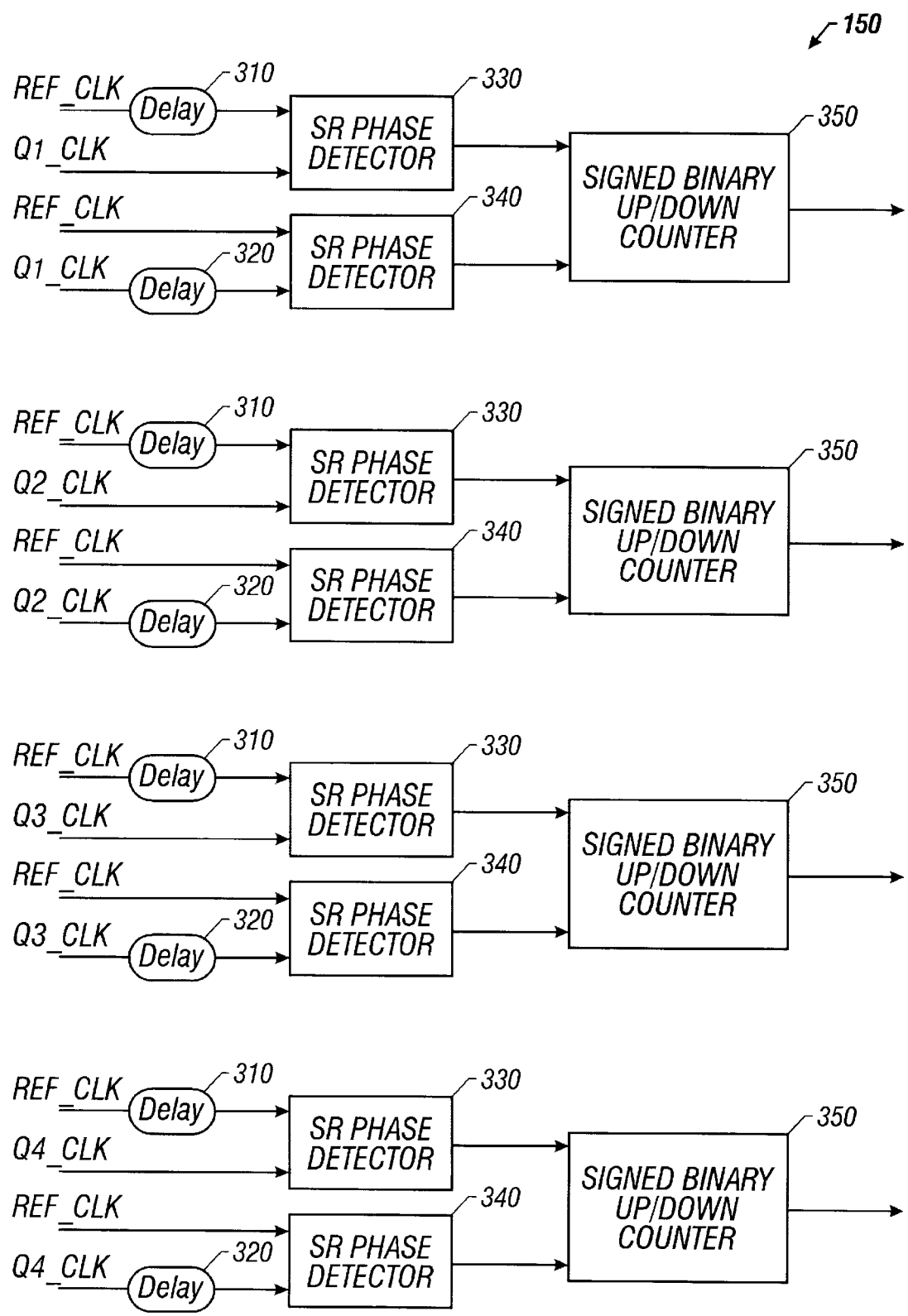
FIG. 3 is a more detailed diagram of a phase relation extraction logic circuit of FIGS. 1A and 1B in accordance with one embodiment of the present invention.
Figure 4:
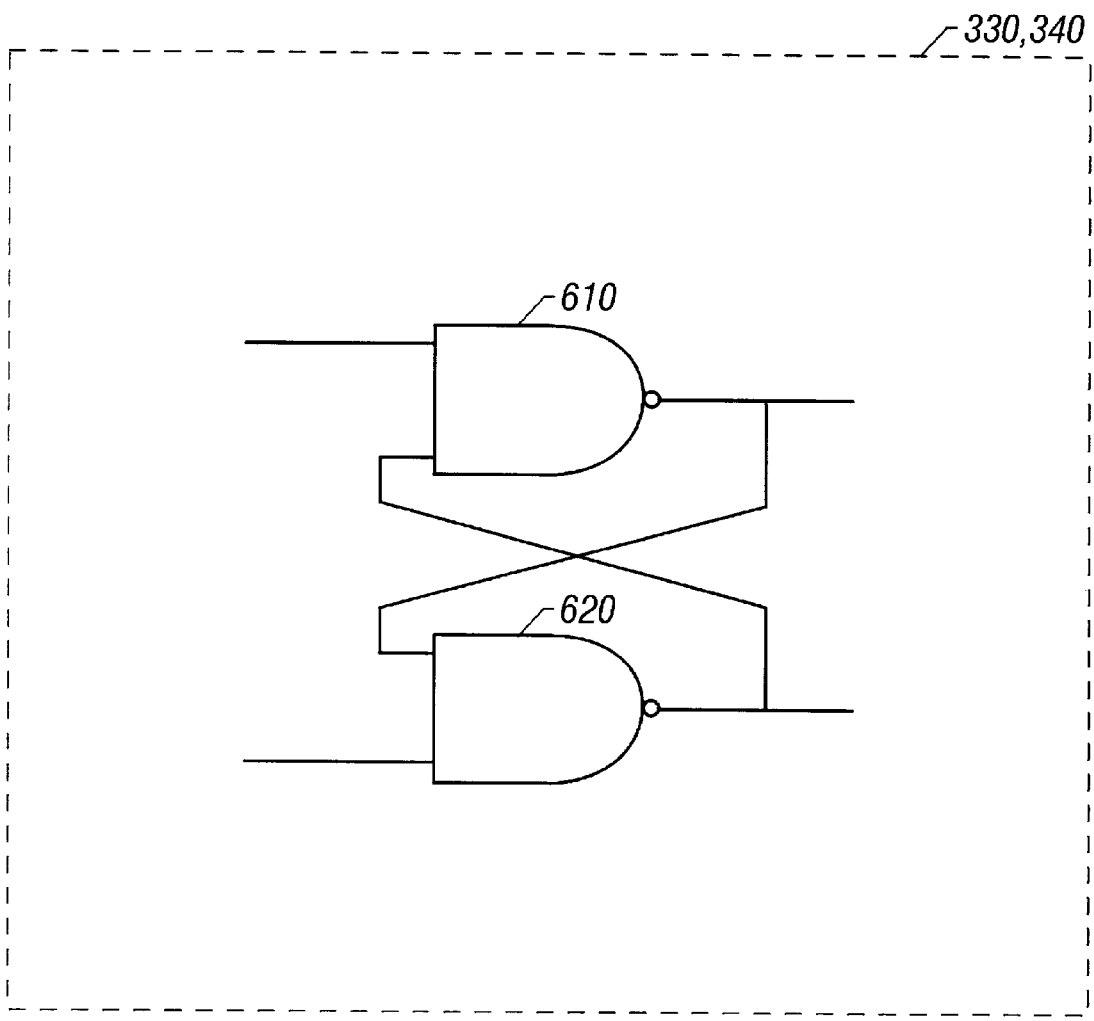
FIG. 4 is a schematic of an SR latch of FIG. 3.

Turning now to FIG. 3, a more detailed diagram of the phase relation extraction logic 150 is shown in accordance with a first embodiment of the present invention. In this particular embodiment, the phase relation extraction logic 150 includes a set of two set-reset (SR) phase detectors 330, 340 for each one of the four quadrant clock signals Q_CLKs of the clock spines Q1–Q4. The SR phase detectors 330, 340 compare the phase relationship of the reference clock signal REF_CLK to each one of the respective quadrant clock signals Q_CLK using the phase input signals from each respective clock spine Q1–Q4. In the illustrated embodiment, the SR phase detectors 330, 340 are SR latches, comprising a pair of cross-coupled NAND gates 610, 620 as shown in FIG. 4; however, it will be appreciated that other types of phase detectors could be used in lieu thereof without departing from the spirit and scope of the invention.

For each pair of phase detectors 330, 340, the input of the reference clock signal REF_CLK for the first phase detector 330 of the pair is delayed by a predetermined unit time via a delay 310, thereby producing a delayed reference clock signal REF_CLK_DEL. The phase of the delayed reference clock signal REF_CLK_DEL is then compared to the phase of each one of the quadrant clock signals Q_CLKS. If the phase detector 330 determines that REF_CLK_DEL leads one of the Q_CLKs, then the phase detector outputs a logical "1", indicating that REF_CLK_DEL leads the particular Q_CLK by at least the predetermined unit time delay produced by delay 310. Conversely, if REF_CLK_DEL does not lead the particular Q_CLK, the phase detector will output a logical "0" indicative of such.

The second phase detector 340 of the pair includes an input of one of the quadrant clock signals Q_CLK that is also delayed by a predetermined unit of time via a delay 320, thereby producing a Q_CLK_DEL signal. If Q_CLK_DEL leads the REF_CLK signal, the phase detector 340 will output a logical "1" indicating that Q_CLK leads the REF_CLK by at least the predetermined unit delay 320. If not, a logical "0" is produced, where the particular quadrant clock signal Q_CLK does not lead the REF_CLK.

The output from the phase detectors 330, 340 are passed to a signed bit up/down counter 350, which determines whether the reference clock signal REF_CLK or one of the quadrant clock signals Q_CLK leads the other. If the output from the phase detector 330 is a logical "1" and the output from phase detector 340 is a logical "0", the REF_CLK leads the particular quadrant clock signal Q_CLK by at least the unit of time delay produced by the delay 310 and an "up" event is output from the up/down counter 350. This occurrence will cause the phase relation extraction logic 150 to turn "on" a set of PMOS and NMOS transistors 210, 220 in the respective active control driver 140 to "speed-up" the lagging quadrant clock signal Q_CLK by the unit of time delay produced by the delay 310.

If the phase detector 330 outputs a logical "0" and the phase detector 340 outputs a logical "1", the particular quadrant clock signal Q_CLK leads the REF_CLK and a "down" event is output from the up/down counter 350. Upon such occurrence, the phase relation extraction logic 150 will activate a capacitive load 260 in the pre-global network 120 to effectively "slow-down" the leading quadrant clock signal Q_CLK by the unit of time delay produced by the delay 320. If the phase detectors 330 and 340 both output a logical "0", then the REF_CLK and the particular quadrant clock signal Q_CLK are desirably "in-phase", and, accordingly, no adjustment to the quadrant clock signal Q_CLK need be made by the phase relation extraction logic 150.

In accordance with the first embodiment, the quadrant clock signals Q_CLKs are incrementally adjusted to become in-phase with the reference clock signal REF_CLK. For example, if a particular quadrant clock signal Q_CLK lags the reference clock signal REF_CLK by 30 picoseconds and the delays 310, 320 produce a 10 picosecond delay, the phase relation extraction logic 150 would incrementally "speed-up" the Q_CLK signal by 10 picoseconds until the 30 picosecond delay of the Q_CLK signal no longer exists (i.e., it is in-phase with the REF_CLK signal).

While the global clock network 100 of the present invention has been discussed primarily in connection with a microprocessor, it will be appreciated that the clock network 100 could be used for any type of synchronous digital system without departing from the spirit and scope of the invention.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A clock network comprising:
   a reference circuit to provide a reference clock signal;
   a plurality of clock spines, each having a respective spine clock signal;
   a set of drivers respectively coupled to said reference circuit and said clock spines to couple the reference clock signal to each of the spines to generate the respective spine clock signals;
   a phase relation extraction logic circuit coupled to receive the reference clock signal and the respective spine clock signals to compare the phase relationship of the reference clock signal to each of the spine clock signals, said phase relation extraction logic circuit to generate a control signal to adjust the phase relationship of a particular spine clock signal; and
   said drivers having active elements switched to reduce delay and passive elements switched to increase delay of the particular spine clock signal.

2. The clock network of claim 1, wherein said phase relation extraction logic circuit further includes a plurality of phase detectors to compare the phase relationships of said spine clock signals to the reference clock signal.

3. The clock network of claim 2, wherein said phase relation extraction logic circuit includes a plurality of counters, each coupled to a pair of said plurality of phase detectors used to obtain phase comparisons said counters to generate the control signal to said drivers.

4. The clock network of claim 2, wherein each phase detector comprises a pair of NAND gates, having a first input coupled to an output of the other NAND gate and a second input coupled to receive signals being compared.

5. The clock network of claim 1
   wherein a driver for each clock spine is comprised of a pre-global driver and one or more active clock drivers.

6. The clock network of claim 5, wherein the active elements are present in the active clock drivers.

7. The clock network of claim 6, wherein said active elements comprise a plurality of PMOS and NMOS transistors.

8. The clock network of claim 6, wherein the passive elements are present in the pre-global driver.

9. The clock network of claim 8, wherein said passive elements comprise a plurality of capacitive loadings.

10. The clock network of claim 8, wherein said clock spines comprise clock spines.

11. A method for reducing clock skew in a clock network, comprising:
   providing a reference clock signal;
   providing a plurality of spine clock signals to a plurality of clock spines by separately coupling the reference clock signal and driving the separate reference clock signal to each of the clock spines;

comparing the reference clock signal to each spine clock signal;

determining if a phase difference exists between the reference clock signal and each of the spine clock signals; and adjusting active elements to reduce delay and passive elements to increase delay of a particular spine clock signal to reduce the phase difference.

12. The method of claim 11, wherein the driving of the separate reference clock signals includes using a pre-global driver stage and one or more active clock driver stages.

13. The method of claim 12, wherein said adjusting further includes switching the active elements in the active clock driver stage and switching the passive elements in said one or more pre-global driver stage.

14. A clock network for a synchronous digital system, comprising:

a reference circuit to provide a reference clock signal;

a plurality of clock spines, each having a respective spine clock signal;

a set of drivers respectively coupled to said reference circuit and said clock spines to couple the reference clock signal to each of the spines to generate the respective spine clock signals;

a phase relation extraction logic circuit coupled to receive the reference clock signal and the respective spine clock signals to compare the phase relationship of the reference clock signal to each of the spine clock signals, said phase relation extraction logic circuit to generate a control signal to adjust the phase relationship of a particular spine clock signal; and said drivers having active elements switched to reduce delay and passive elements switched to increase delay of the particular spine clock signal.

* * * * *

UNITED STATES PATENT AND TRADEMARK OFFICE
CERTIFICATE OF CORRECTION

PATENT NO. : 6,298,105 B1
DATED : October 2, 2001
INVENTOR(S) : Dai et al.

It is certified that error appears in the above-identified patent and that said Letters Patent is hereby corrected as shown below:

<u>Column 6,</u>
Line 62, delete "comprise clock spines" and insert -- comprise four clock spines --.

<u>Column 7,</u>
Line 19, delete "pre-global driver stage" and insert -- pre-global driver stages --.

Signed and Sealed this

Fourth Day of June, 2002

*Attest:*

JAMES E. ROGAN
*Attesting Officer*     *Director of the United States Patent and Trademark Office*